(12) United States Patent
Hanan et al.

(10) Patent No.: US 9,006,000 B2
(45) Date of Patent: Apr. 14, 2015

(54) TJ TEMPERATURE CALIBRATION, MEASUREMENT AND CONTROL OF SEMICONDUCTOR DEVICES

(75) Inventors: Deny Hanan, Kfar Harif (IL); Eddie Redmard, Netanya (IL); Itai Dror, Omer (IL)

(73) Assignee: SanDisk Technologies Inc., Plano, TX (US)

( * ) Notice: Subject to any disclaimer, the term of this patent is extended or adjusted under 35 U.S.C. 154(b) by 75 days.

(21) Appl. No.: 13/463,056

(22) Filed: May 3, 2012

(65) Prior Publication Data

US 2013/0295697 A1    Nov. 7, 2013

(51) Int. Cl.
*H01L 21/00*    (2006.01)
*G01R 31/28*    (2006.01)
*G01R 31/26*    (2014.01)

(52) U.S. Cl.
CPC ........ G01R 31/2884 (2013.01); *G01R 31/2644* (2013.01)

(58) Field of Classification Search
USPC .................................................... 438/10–13
See application file for complete search history.

(56) References Cited

U.S. PATENT DOCUMENTS

| | | | |
|---|---|---|---|
| 4,779,161 A * | 10/1988 | DeShazo, Jr. | 361/106 |
| 5,502,838 A | 3/1996 | Kikinis | |
| 5,508,230 A | 4/1996 | Anderson et al. | |
| 6,058,012 A * | 5/2000 | Cooper et al. | 361/704 |
| 6,157,244 A | 12/2000 | Lee et al. | |
| 6,603,665 B1 | 8/2003 | Truong et al. | |
| 6,873,170 B2 | 3/2005 | Asam et al. | |
| 7,191,413 B2 | 3/2007 | Chandra et al. | |
| 7,436,059 B1 * | 10/2008 | Ouyang | 257/712 |
| 8,476,630 B2 * | 7/2013 | Johnson | 257/49 |
| 8,486,761 B2 * | 7/2013 | Bierhuizen | 438/111 |
| 2004/0037346 A1 | 2/2004 | Rusu et al. | |
| 2005/0040810 A1 | 2/2005 | Poirier et al. | |
| 2005/0054125 A1 | 3/2005 | Ku | |
| 2006/0075286 A1 * | 4/2006 | Hodge et al. | 714/5 |
| 2006/0075760 A1 * | 4/2006 | Im et al. | 62/3.7 |
| 2006/0244475 A1 | 11/2006 | Kirby et al. | 324/765 |
| 2007/0004055 A1 * | 1/2007 | Ball et al. | 438/14 |
| 2007/0158776 A1 | 7/2007 | Julio et al. | |
| 2008/0129371 A1 * | 6/2008 | Hartmann et al. | 327/513 |
| 2008/0150111 A1 * | 6/2008 | Hiller et al. | 257/686 |
| 2008/0281476 A1 | 11/2008 | Bose et al. | |

(Continued)

FOREIGN PATENT DOCUMENTS

JP    2009081246 A    4/2009

OTHER PUBLICATIONS

English Abstract of Publication No. JP2009081246 published on Apr. 16, 2009.

(Continued)

*Primary Examiner* — Charles Garber
*Assistant Examiner* — Brigitte Paterson
(74) *Attorney, Agent, or Firm* — Vierra Magen Marcus LLP

(57) ABSTRACT

A semiconductor device, such as a semiconductor die, is disclosed including embedded temperature sensors for scanning the junction temperature, Tj, at one or more locations of the semiconductor die while the die is operating. Once a temperature of a hot spot is detected that is above a temperature specified for the die or package containing the die, the die/package may be discarded. Alternatively, the functionality of the die may be altered in a way that reduces the temperature of the hot spots.

28 Claims, 6 Drawing Sheets

(56) References Cited

U.S. PATENT DOCUMENTS

2011/0029153 A1 2/2011 Shah et al.
2013/0207107 A1* 8/2013 Kuo .............................. 257/48

OTHER PUBLICATIONS

International Search Report and Written Opinion dated Jul. 19, 2013 in International Patent Application No. PCT/US2013/039135.

H. Oprins et al., "Steady State and Transient Thermal Analysis of Hot Spots in 3D Stacked ICs using Dedicated Test Chips", Semiconductor Thermal Measurement and Management Symposium (Semi-Therm), 2001, 27th Annual IEEE, Mar. 20, 2011, pp. 131-137.

H. Oprins et al., "Thermal test vehicle for the validation of thermal modelling of hot spot dissipation in 3D stacked ICs", Electronic System-Integration Technology Conference (ESTC), 2010, IEEE, Sep. 13, 2010.

* cited by examiner

TJ TEMPERATURE CALIBRATION, MEASUREMENT AND CONTROL OF SEMICONDUCTOR DEVICES

BACKGROUND OF THE INVENTION

1. Field

The present technology relates to semiconductor devices.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die mounted to a substrate 26. Three die 24, 26 and 28 are shown, but the package may include more or less die in further examples. Where the package is used as or within a memory card, one or more of the semiconductor die (e.g., die 24, 26) may be a non-volatile memory die, and one of the die (e.g., die 28) may be a controller die such as an ASIC. It is known to layer semiconductor die on top of each other either with an offset (prior art FIG. 1) or in a stacked configuration separated by a spacer layer 34 (prior art FIG. 2). Although not shown in FIGS. 1 and 2, the semiconductor die are formed with die bond pads on an upper surface of the die.

Substrate 28 may be formed of an electrically insulating core sandwiched between upper and lower conductive layers. The upper and/or lower conductive layers may be etched to form conductance patterns including electrical leads and contact pads. Wire bonds may be soldered between the die bond pads of the semiconductor die 22, 24, 26 and the contact pads of the substrate 28 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

As semiconductor packages are made smaller and power requirements increase, overheating of semiconductor die in the package is becoming a significant concern. In particular, present controller die are made with embedded high power transistors and other components which result in localized hot spots in the die. The increased heating significantly increases the aging of these components as well as affecting the normal operation and aging of the circuits in the immediate vicinity on the same die. Moreover, the highly non-uniform temperature distribution across the die introduces thermo-mechanical stresses in the die. As a result, the lifetime of the die decreases.

Localized hot spots may also be harmful to the operation of other die and components in a package including the controller die. This problem may be particularly acute in the case of a stacked-die memory package, where the controller die is stacked directly on top of the uppermost memory die (as shown in prior art FIGS. 1 and 2). Memory die are highly susceptible to temperature changes, and overheating of the attached controller die may cause performance degradation in one or more of the memory die in the die stack near the controller die. Packages containing these die may normally pass the standard screen tests, but then fail in an unacceptably short period of time in use by a customer or end-user.

One problem in identifying hot spots is that not all semiconductor die have hot spots in the same place or to the same degree. Each step in the multitude of fabrication steps of a semiconductor die has some degree of variation. Thus, for example, different electrical traces laid down within a semiconductor die may be more or less narrow from die to die. A narrow trace segment will result in higher resistance and higher temperatures through that segment. Semiconductor die may further include power regulators, which convert a supply voltage to a working voltage. Due to process variations, some of these regulators may be less efficient, and therefore run hotter than others.

DETAILED DESCRIPTION

Embodiments will now be described with reference to FIGS. 3 through 13 which relate to a semiconductor device, such as a semiconductor die, including embedded temperature sensors for scanning the junction temperature, Tj, at one or more locations of the semiconductor die while the die is operating. The temperature sensors may be embedded as an array including a number of rows and columns. Alternatively, the temperature sensors may be embedded at locations that coincide with components within the die predicted to generate a significant amount of heat.

The semiconductor die including the temperature sensors may for example be a controller die, though it may be other die such as for example flash memory die in further embodiments. The die including the temperature sensors may be tested as an individual die, before or after dicing from a wafer, or after packaging in a semiconductor package with other semiconductor die. Once a hot spot is detected in the die that is above a temperature specified for the die or package containing the die, the die/package may be discarded. Alternatively, the functionality of the die may be altered in a way that reduces the temperature of the hot spot.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

Figure 1:
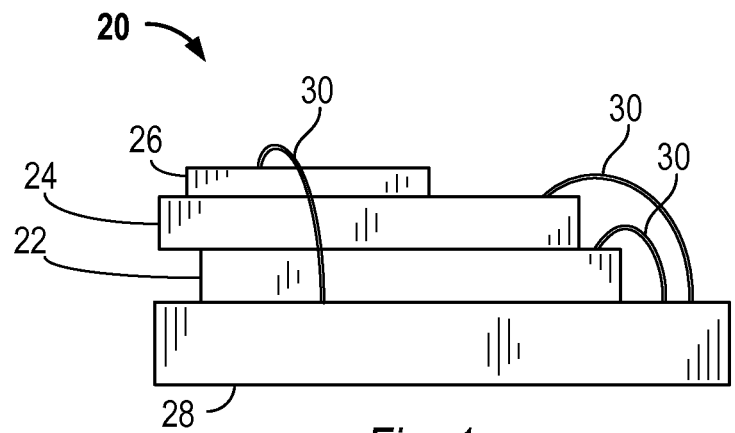
FIGS. 1 and 2 are prior art edge views of two conventional semiconductor package designs with the molding compound omitted.
Figure 2:
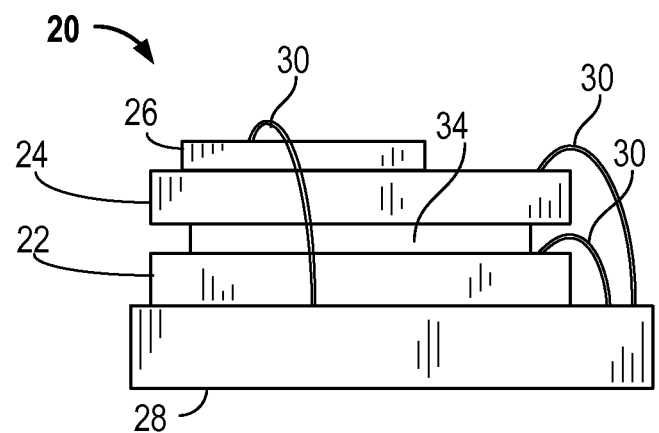
Figure 3:
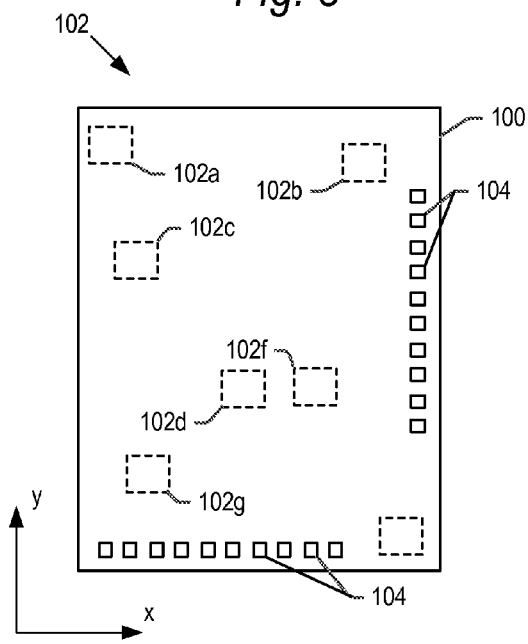
FIG. 3 is a top view of a semiconductor die including heat-generating components.

FIG. 3 shows a top view of a semiconductor die 100 including a plurality of discrete components 102a, 102b, 102c, 102d, 102f, 102g, 102h, collectively referred to as components 102. The semiconductor die 100 may for example be a controller chip such as an ASIC, though die 100 may be other types of semiconductor die including but not limited to a non-volatile flash memory chip. The components 102 may be variety of different components defined in a known manner within the die 100 during the deposition, patterning, doping and other steps of integrated circuit fabrication. Some or all of the components 102 may generate heat during operation of the die 100. As one example, it is known that analog circuits defined within die 100 are high power, high heat-dissipating components. Power regulators, transistors and relatively narrow electrical trace segments are further examples of heat-generating components. Components 102 may comprise these and/or other heat-generating components. A heat map may be generated by finite element analysis of the die 100 to predict where the hot spots on die 100 will be owing to heat-generating components of components 102.

The junction temperature, Tj, represents the temperature of discrete locations of the die 100 due to the electrical activity of the components 102 during normal operation of the die at a certain ambient temperature, Ta. FIG. 3 shows arbitrarily-defined Cartesian axes x and y for die 100. Tj may be provided for a discrete x-y location on die 100, and is further time dependent (t). As such, Tj may be written herein as Tj(x, y, t). In further embodiments, temperature may further be defined for die 100 as a function of a z axis, perpendicular to both the x and y axes (e.g., into/out of the page of FIG. 3). In such embodiments, Tj may be written as Tj(x, y, z, t). As explained below, consideration of temperature as a function of the z-axis may also be used when analyzing the junction temperature of a stack of semiconductor die 100, which may include one or more flash memory die and a controller die.

Embodiments of the present technology operate using an array of temperature sensors embedded into the internal circuitry of the die 100 during manufacturing of die 100. Temperature sensors for this use are known, and may be formed of a diode, resistor or a transistor. Such temperature sensors are able to determine the temperature of the die 100 at a discrete location and at a discrete time without affecting the operational functionality of the die 100. Details of examples of a temperature sensor which may be integrated as part of the die 100 are disclosed for example in U.S. Pat. No. 7,901,134, entitled "Semiconductor Temperature Sensor," and U.S. Published Patent Application No. 2010/0008398, entitled, "Semiconductor Temperature Sensor," both of which are incorporated herein by reference in their entirety. Other known temperature sensors may be used in accordance with the present technology.

Figure 4:
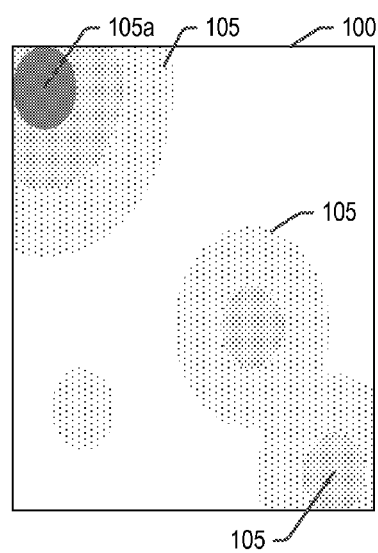
FIG. 4 is a heat map of a semiconductor die showing localized heating of a die in the x-y plane of the die.

FIG. 4 illustrates a possible heat map that may for example be generated from the die 100 including components 102 shown in FIG. 3. The darker shaded areas 105 represent areas in the x-y plane of die 100 that were measured to be hotter than the lesser shaded areas. The heat map 100 may be generated from Tj measurements over a period of time, or measured at an instantaneous moment during operation of the die 100. In this example, one of the shaded areas, 105a, may exceed some predetermined temperature threshold for a specification of die 100, or for a package in which die 100 is to be included.

Figure 5:
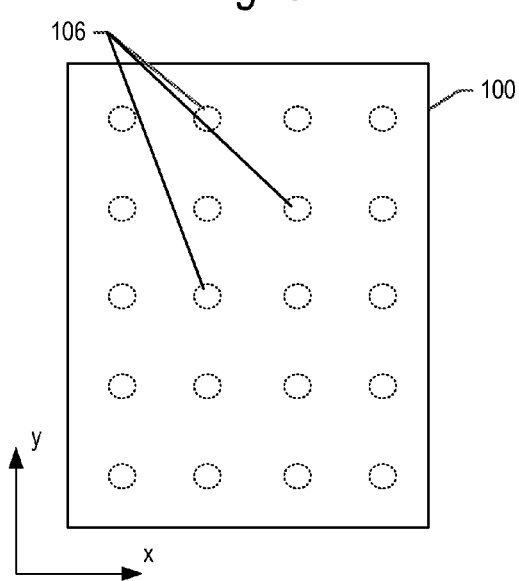
FIG. 5 is a top view of a first embodiment of an array of temperature sensors which may be provided in a semiconductor die for Tj scanning of the semiconductor die.
Figure 6:
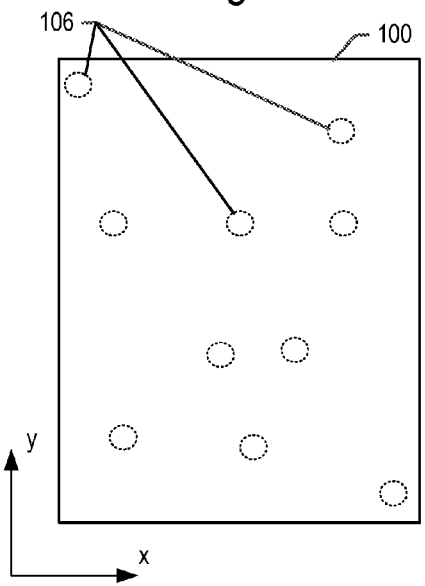
FIG. 6 is a top view of a second embodiment of an array of temperature sensors which may be provided in a semiconductor die for Tj scanning of the semiconductor die.
Figure 7:
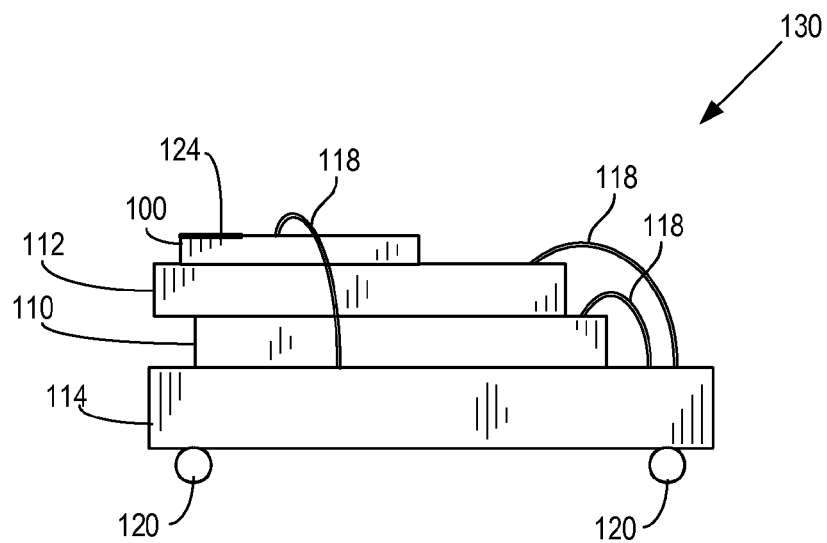
FIGS. 7 and 8 are side and top views, respectively, of a semiconductor package according to embodiments of the present technology, before encapsulation, including a heat sink for dissipating heat from a hot spot on a die in the package.
Figure 8:
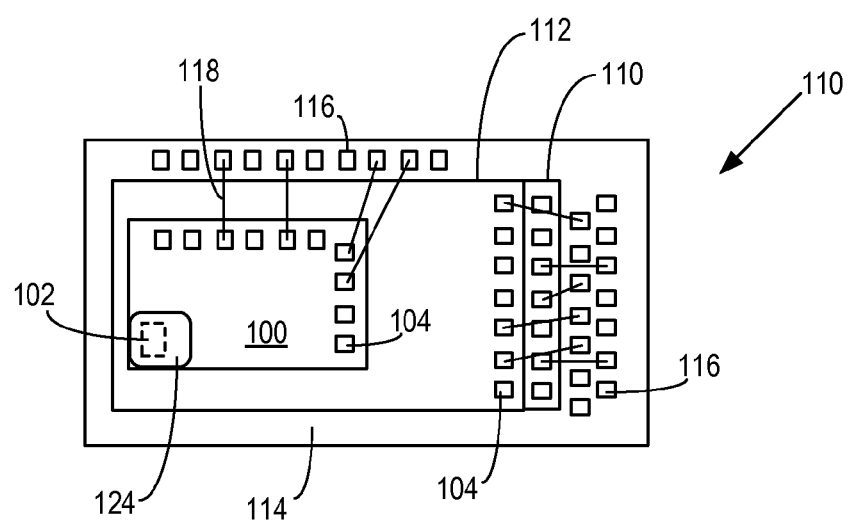

The heat map of FIG. 4 may be generated by an array of embedded temperature sensors 106, embodiments of which are shown in FIGS. 5 and 6. In the embodiment of FIG. 5, the temperature sensors 106 (some of which are labeled) may be provided in a uniform array of M rows and N columns, where M and N may vary. The number of sensors 106 in the array may depend on the level of expected temperature homogeneity across the die 100, as predicted by thermal simulation mapping and/or on the number of heat dissipating components. In examples, there may be two to twenty rows and there may be two to sixteen columns. These ranges are by way of example only, and there may be greater or lesser number of rows and/or columns in further embodiments.

The sensors could be evenly spaced forming a symmetrical grid as shown in FIG. 5. Alternatively the rows and/or columns may be unevenly spaced from each other in further embodiments. In further embodiments, the sensors may be distributed relatively uniformly across die 100, but not formed in rows and/or columns.

Each of the temperature sensors 106 is capable of in-situ measuring of the absolute Tj(x, y, t) temperature values and the temperature distribution across the die. The output of each temperature sensor may be a resistance value that is provided to respective die bond pads 104, some of which are shown and labeled in FIG. 3. The output may alternatively be converted to a digital output and relayed to die bond pads 104. A digital output may for example indicate wither the measured temperature at a sensor 106 is above or below a predetermined maximum-allowable temperature value The output of each of the sensors 106 is used as explained hereinafter.

In a further embodiment shown in FIG. 6, the temperature sensors 106 may be concentrated at least at predicted hot spots on the die 100. As noted above, the hot spots on a die may be predicted using finite element analysis, for example during die design or prototype die manufacture and testing. From this analysis, components 102 which generate heat potentially above some threshold may be predicted, and a temperature sensor 106 may be provided at or near the location of these components 102. It may be that the threshold temperature is the same for all locations that are to receive a temperature sensor 106. Alternatively, the threshold temperatures may be different for different components.

As in the embodiment of FIG. 5, each of the temperature sensors 106 in FIG. 6 is capable of in-situ measuring of the absolute Tj(x, y, t) temperature values. The output of each temperature sensor may be provided to respective die bond pads 104, some of which are shown and labeled in FIG. 3. The output of each of the sensors 106 is used as explained hereinafter.

In embodiments, in order to evaluate the absolute temperature from temperature sensors 106, a calibration process may be performed for one, two or any number of the temperature sensors 106. This calibration process may be performed before or during the testing stage of the die 100 (explained below), and may be performed manually or automatically.

The Tj calibration process includes measurements of the non-operating die 100 at two or more known ambient temperatures. For example, the ambient temperature may be set at 30° C. and the output resistance of one or more of the sensors 106 may be determined. Given variations in the fabrication process, different sensors may output different resistances, despite all measuring the same ambient temperature.

The process may be repeated at one or more different ambient temperatures, for example at 50° C., for the one or more sensors 106. As the temperature response for each of the sensors 106 may be generally linear, using the two or more measured points, a plot of resistance to temperature may be developed for each calibrated sensor. This plot allows identification of a temperature for a measured output resistance of the one or more sensors during operation of the device 100. It is understood that known temperature sensors 106 may be used which do not have resistance variations for a given temperature. In the event such temperature sensors 106 are used, the calibration process may be omitted.

The above-described embodiments may be used to screen the junction temperature of the die 100 in a variety of ways and at a variety of different stages in package fabrication. For example, screening of the Tj of the die 100 can be performed while the die 100 is still affixed as part of a wafer having many dies 100, as an individual die after dicing of the wafer, as a die mounted on a substrate, and/or after the die 100 is incorporated into a finished semiconductor package. Each of these possible Tj screening points is explained below. It is understood that Tj screening may be performed at two or more of these screening points in further embodiments.

Tj screening may be performed when the die 100 is part of a wafer of dies 100. In this example, the wafer may be supported on a chuck, and probes may be used to access some or all of the die bond pads that are connected to the different temperature sensors 106. While the die 100 is operating, the probes read the junction temperature Tj of one or more temperature sensors at a discrete point in time, or over a time interval, at a given ambient temperature Ta.

This Tj screening step may be performed on each die on the wafer or one or more select die on the wafer. Moreover, this Tj screening step may be performed manually or by an automated testing assembly where one or more testing probes may access the temperature of the respective sensors 106 in parallel or serially. Where parallel readings are taken by an automated testing assembly, the assembly may test a single die at a time, or multiple dis on the wafer simultaneously.

The Tj screening of die 100 may alternatively occur after the die 100 has been diced from the wafer. In this example, the die 100 may be supported on a chuck and the temperature of the respective sensors read manually or automatically as described above.

Whether before or after dicing from the wafer, the information gained from screening of the die 100 may be used in a variety of ways. The Tj screening may reveal that a die has one or more hot spots (e.g., area 105a in FIG. 4) that are operating at a temperature that exceeds specification for that die, or for a semiconductor package in which that die is to operate. From this information, it may be determined that the hot spot will cause failure of the die and/or package in which the die is mounted in an unacceptably short period of time.

In embodiments, upon identifying such a die, the die may be discarded. Alternatively, the functionality of the die may be altered in a way that reduces the temperature of the one or more hot spots. For example, it may be possible to reduce the clock speed of the die 100. Alternatively or additionally, it may be possible to selectively turn power off to certain components 102 or specific areas of the die, thereby reducing the temperature of the hot spots. It may be that modifying the functionality of the die 100 in this manner is not possible, in which case the die may be discarded.

It may happen that hot spots on a die are not so hot as to require disposal of the die, but the hot spots are a concern with regard to mounting that die with others in a semiconductor package. In this instance, Tj screening of the die before or after dicing of the wafer can be useful in identifying the degree and location of hot spots, which information may then be used to determine packaging configuration. In particular, if it is known that a die 100 has hot spots, it may be possible to design the package layout in a way that reduces the likelihood that the hot spots will adversely affect operation of the package.

Embodiments where Tj screening information is used to determine packaging configuration will now be described with reference to FIGS. 7-10. These figures show die 100 assembled into a semiconductor package 130 along with other die 110, 112. In this example, die 100 may be a controller die, and die 110, 112 may be flash memory die. It is understood that flash memory die 110, 112 may include temperature sensors 106 and be scanned as described above instead of or in addition to die 100.

The package 130 includes a substrate 114 on which the die 110, 112 and 100 are mounted. Wire bonds 118 (some of which are shown in FIGS. 7-10) may be provided as is known between die bond pads 104 of die 100, 110, 112 and contact pads 116 on substrate 114. The signals from the die 110, 112 and 100 may be transferred between the package 130 and a host device (not shown) via solder balls 120 on a bottom surface of the substrate 114.

The solder balls 120 allow the package 130 to be permanently affixed to a printed circuit board of the host device in a so-called BGA (ball grid array) package. Instead of solder balls, contact fingers of known construction may be provided on a bottom surface of the substrate 114 in a so-called LGA (land grid array) package. In such embodiments, the contact fingers allow communication between the package 130 and a host device in which the package 130 is removably inserted.

If a hot spot is detected on die 100 by temperature sensors 106, such as area 105a of FIG. 4, there may be few possibilities for using the die 100 in package 130 instead of discarding it. For example, depending on the height requirements for package 130, it may be possible to mount a heat sink 124 on die 100 covering the hot spot to help dissipate heat from the hot spot. The heat sink 124 may cover just the hot spot as shown, or may cover up to the entire surface of die 100 in further embodiments. The heat sink may for example be a thin plate formed of a known material, such as for example aluminum or an aluminum alloy adhered to the upper surface of die 100, for example by a thermally conductive adhesive.

Figure 9:
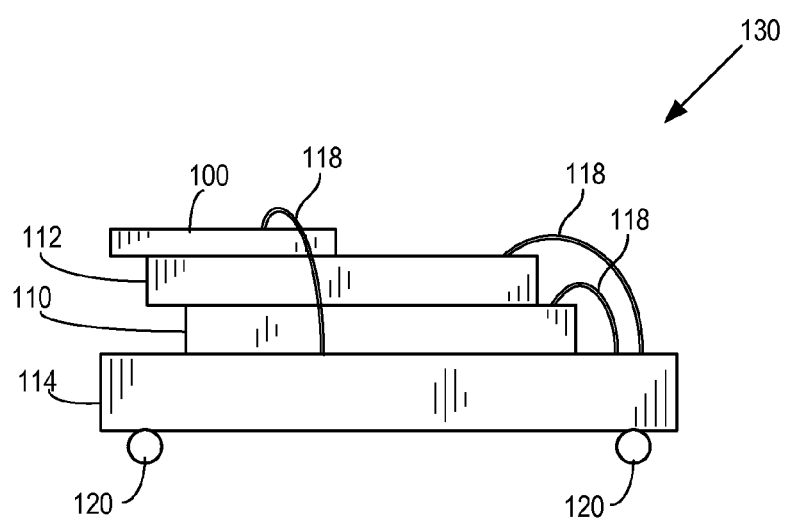
FIGS. 9 and 10 are side and top views, respectively, of a semiconductor package according to embodiments of the present technology, before encapsulation, including a die configuration where a hot spot on a first die overhangs a second die on which the first die is mounted.
Figure 10:
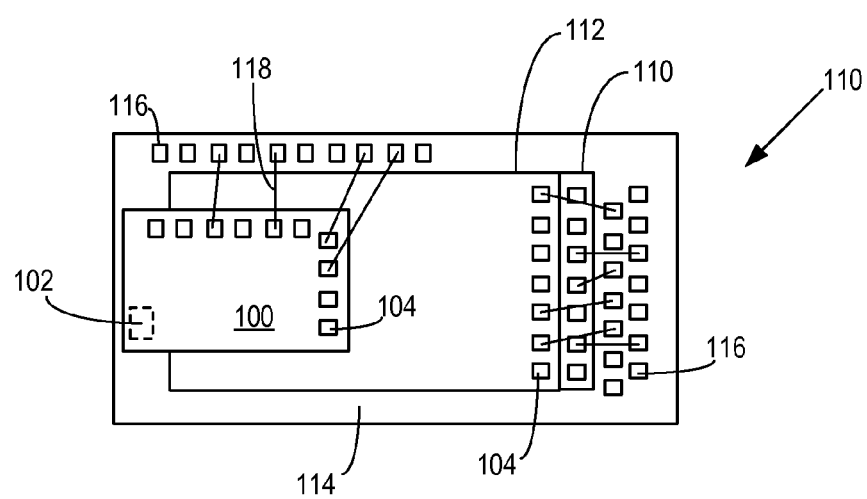

FIGS. 9 and 10 show a further alternative where a hot spot such as area 105a is detected on die 100. In this embodiment, depending on where the hot spot is located on die 100, it may be possible to mount the die 100 to extend beyond the edge of die 112 on which die 100 is mounted. In so doing, the problematic hot spot does not lie directly over the flash memory die. This will reduce the likelihood that heat from the hot spot on die 100 will affect the flash memory die.

Figure 11:
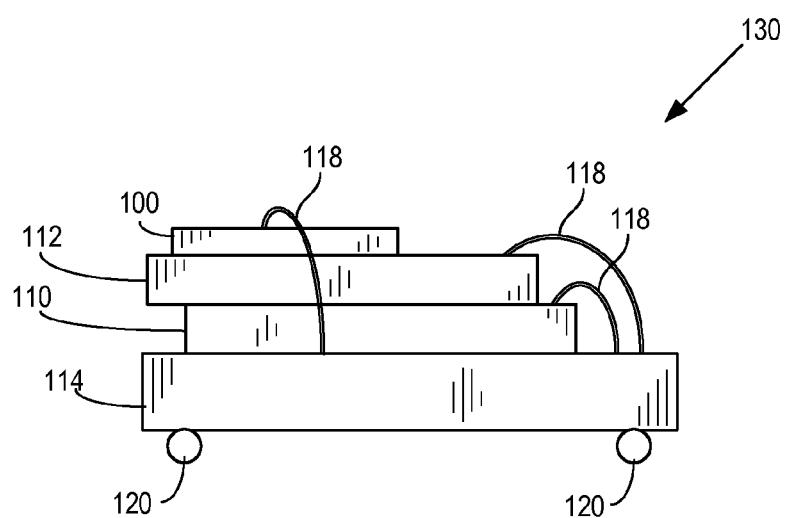
FIGS. 11 and 12 are side and top views, respectively, of a semiconductor package according to embodiments of the present technology before encapsulation.
Figure 12:
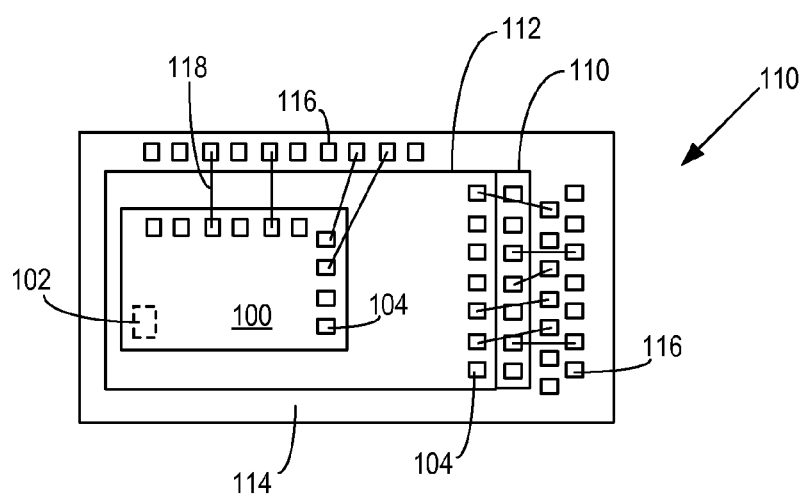
Figure 13:
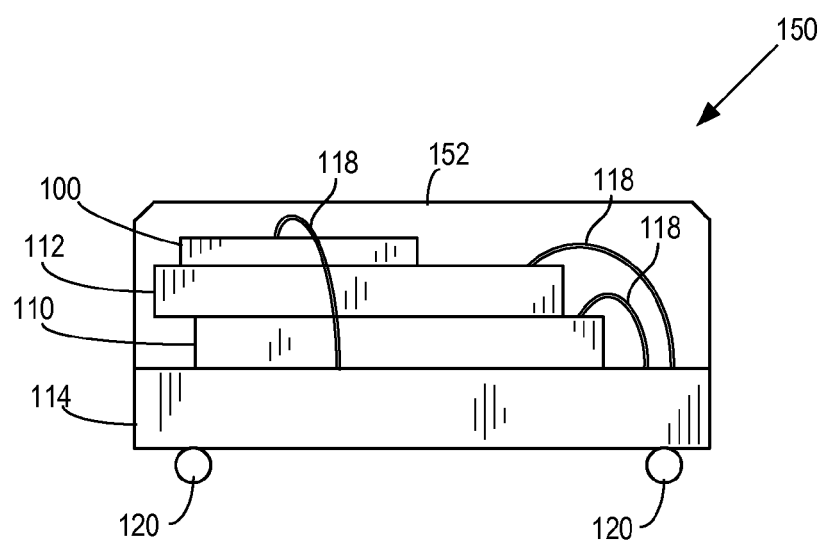
FIG. 13 is a side view of a semiconductor package according to embodiments of the present technology after encapsulation.

Instead of screening die 100 by itself, the die 100 may be screened for its temperature profile after the die 100 is incorporated into a semiconductor package 130. The semiconductor package in this embodiment may have been designed with a knowledge of where actual or potential hot spots are, so as to already include a heat sink 124 as in FIGS. 7 and 8, or to have an overhang as in FIGS. 9 and 10. Alternatively, the package 130 in this embodiment may be provided without a heat sink or overhang, as shown in FIGS. 11 and 12.

After die 100 has been mounted within the package 130, it may still be possible to test the junction temperature Tj from each of the sensors 106 by directly accessing the die bond pads 104 coupled to the respective sensors 106. However, it may be that the die bond pads 104 coupled to sensors 106 are not easily accessed directly, for example where wire bonds 118 to bond pads 104 have already been formed. It may also be difficult for the test structure probes to directly access the die bond pads 104 of die 100 where there are one or more die mounted on top of die 100. In such embodiments, the temperature from the respective sensors may be read by placing the package 130 on a testing fixture so that the solder balls 120 lie in contact with test pads on the texting fixture. As noted above, some of the solder balls 120 may be coupled to the die bond pads 104 receiving the signals from temperature sensors 106. These signals may thus be communicated from the temperature sensors 106 to the testing fixture.

Once mounted in the package 130, the Tj(x, y, t) may be measured for die 100 as described above. If it is determined that die 100 includes one or more hot spots that exceed the specification for the die 100 or package 130, the package 130 may be discarded. Alternatively, the operation of the package 130 may be altered, if possible, in a way that reduces the temperature of the one or more hot spots. For example, it may be possible to reduce the clock speed of the die 100. Alternatively or additionally, it may be possible to selectively turn power off to certain components 102 or specific areas of the die, thereby reducing the temperature of the hot spots. As a further alternative, it is conceivable that the package could be reclaimed by removing the die 100 having hot spots and replacing it with a die 100 that does not have hot spots.

As noted above, temperature sensors 106 may be used to determine the temperature in an x-y plane of the die. However, in further embodiments, the sensors may be provided within a die 100 in multiple x-y planes along a z axis to provide a three-dimensional temperature profile in the x-y-z space of the die 100. As a further alternative, temperature sensors may be provided in more than one of the die in package 130, for example in each of the die 110, 112 and 100. In such embodiments, the temperature sensors together may be used to provide Tj(x, y, z, t) in the three-dimensional space of the entire die stack. This will allow identification of hot spots in a particular die 110, 112, 100, as well as the temperature effect of that die on neighboring die.

A final step in package fabrication is to encapsulate the package 130 (shown in any of FIGS. 7-12) in molding compound that protects the die and bond wires and prevents moisture from entering the package. Such a finished package 150 is shown in side view in FIG. 13, in which molding compound 152 is added to the package 130 of any of the above-described embodiments.

The finished semiconductor package 150 may be screened for temperature by mounting the package 150 on a testing fixture having test pads as described above. Where one or more die in the package exhibit junction temperatures Tj that exceed the temperature specification for that die or package, the package 150 may be discarded. If possible, the operation of the package 150 may be altered in a way that reduces the temperature of the one or more hot spots as described above.

In addition to the above-described Tj scanning operations, the present technology may be used for package failure analysis after a package has failed and been returned by the customer or end-user of the package 150. In this embodiment, the Tj scanning operations may be used to determine whether the package 150 exhibits hot spots that may have caused or contributed to the package failure.

In summary, in one example, the present technology relates to a method of providing a semiconductor die, comprising: (a) embedding a plurality of temperature sensors within the semiconductor die; (b) scanning one or more of the plurality of temperature sensors within the semiconductor die while the semiconductor die is operating to determine whether a temperature at one or more locations of the operating semiconductor die exceed a predetermined temperature; (c) taking one of the following actions upon determining that one or more locations of the semiconductor die exceed the predetermined temperature: (i) discarding the semiconductor die, (ii) altering operation of the die to reduce the temperature of the one or more locations exceeding the predetermined temperature, and (iii) configuring a package in which the semiconductor die is to be included to reduce an impact on the semiconductor package of the one or more locations exceeding the predetermined temperature.

In another example, the present technology relates to a method of providing a semiconductor die in a semiconductor package, comprising: (a) forming a substrate with a plurality of contact pads, and electrical couplings for communicating signals between the contact pads and a host device with which the semiconductor package communicates; (b) mounting a semiconductor die on the substrate, the semiconductor die including a plurality of temperature sensors within the semiconductor die and a plurality of die bond pads, the plurality of temperature sensors electrically coupled to the plurality of die bond pads; (c) electrically connecting the plurality of die bond pads on the die to the plurality of contact pads on the substrate; (d) scanning one or more of the plurality of temperature sensors within the semiconductor die, while the semiconductor die is operating, via a test device in contact with the electrical couplings on the substrate to determine whether a temperature at one or more locations of the operating semiconductor die exceed a predetermined temperature; (e) taking one of the following actions upon determining that one or more locations of the semiconductor die exceed the predetermined temperature: (i) discarding the semiconductor die and/or package, and (ii) altering operation of the die to reduce the temperature of the one or more locations exceeding the predetermined temperature.

In another example, the present technology relates to a method of providing flash memory die and a controller die in a flash memory package, comprising: (a) forming a substrate with a plurality of contact pads, and electrical couplings for communicating signals between the contact pads and a host device with which the flash memory package communicates; (b) mounting the flash memory die and controller die on the substrate, the flash memory die and controller die each including a plurality of temperature sensors; (c) scanning one or more of the plurality of temperature sensors within the flash memory die and controller die, while the semiconductor die is operating, to provide a three-dimensional heat map of the temperature within both the flash memory die and controller die, the three-dimensional heat map used to determine whether a temperature at one or more locations in the flash memory die and controller die exceed a predetermined temperature for the flash memory die and/or the controller die; and (d) taking one of the following actions upon determining that one or more locations of the semiconductor die exceed the predetermined temperature: (i) discarding the flash memory die, controller die and/or flash memory package, and (ii) altering operation of the die to reduce the temperature of the one or more locations exceeding the predetermined temperature.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of providing a first semiconductor die in a semiconductor package, comprising:
   (a) embedding a plurality of temperature sensors within the first semiconductor die;
   (b) scanning one or more of the plurality of temperature sensors within the first semiconductor die while the semiconductor die first is operating to determine whether a temperature at one or more locations of the operating first semiconductor die exceed a predetermined temperature;
   (c) determining that one or more locations of the first semiconductor die exceed the predetermined temperature; and
   (d) configuring a package in which the first semiconductor die is to be included so that the first semiconductor die is mounted atop a second semiconductor die with the one or more locations of the first semiconductor die that exceed a predetermined temperature hanging over an edge of the second semiconductor die.

2. The method of claim 1, wherein the step (d) further comprises the step of adding a heat sink to the first semiconductor die over at least the one or more locations of the first semiconductor die exceeding the predetermined temperature during operation.

3. The method of claim 1, wherein the step (a) comprises the step of embedding an array of temperature sensors including a first number of rows and a second number of columns.

4. The method of claim 1, wherein the step (a) comprises the step of embedding an array of temperature sensors at locations predicted to run hotter than other locations of the first semiconductor die.

5. The method of claim 1, wherein the step (b) of scanning one or more of the plurality of temperature sensors within the first semiconductor die is performed while the die is part of a wafer of dies.

6. The method of claim 5, wherein the step (b) of scanning one or more of the plurality of temperature sensors within the first semiconductor die comprises the step of automatically scanning two or more of the plurality of temperature sensors simultaneously with scanning probes.

7. The method of claim 1, wherein the step (b) of scanning one or more of the plurality of temperature sensors within the first semiconductor die is performed after the die is diced from a wafer of dies and before the die is mounted on a substrate.

8. The method of claim 1, wherein the step (b) of scanning one or more of the plurality of temperature sensors within the first semiconductor die is performed after the die is mounted on a substrate and before the substrate is wire bonded.

9. The method of claim 1, wherein the step (b) of scanning one or more of the plurality of temperature sensors within the first semiconductor die is performed after the die is wire bonded to the substrate and before the die is encapsulated.

10. The method of claim 1, wherein the step (b) of scanning one or more of the plurality of temperature sensors within the first semiconductor die is performed after the die is encapsulated.

11. The method of claim 1, wherein the first semiconductor die is a controller die.

12. A method of providing a controller die in a semiconductor package, comprising:
   (a) embedding a plurality of temperature sensors within the controller die;
   (b) scanning one or more of the plurality of temperature sensors within the controller die to determine whether a temperature at one or more locations of the controller die exceed a predetermined temperature;
   (c) determining that one or more locations of the controller die exceed the predetermined temperature; and
   (d) configuring a package in which the controller die is to be included so that the controller die is mounted atop a memory die with the one or more locations of the controller die that exceed a predetermined temperature hanging over an edge of the memory die.

13. A method of providing a first semiconductor die in a semiconductor package, comprising:
   (a) embedding a plurality of temperature sensors within the first semiconductor die;
   (b) scanning one or more of the plurality of temperature sensors within the first semiconductor die to determine whether a temperature at one or more locations of the first semiconductor die exceed a predetermined temperature;
   (c) determining that one or more locations of the first semiconductor die exceed the predetermined temperature; and
   (d) configuring a package in which the first semiconductor die and a second semiconductor die are to be included with the first and second semiconductor die lying one on top of the other, with the one or more locations of the first semiconductor die that exceed a predetermined temperature positioned over an edge of the second semiconductor die.

14. The method of claim 13, wherein the step (a) comprises the step of embedding an array of temperature sensors including a first number of rows and a second number of columns.

15. The method of claim 13, wherein the step (a) comprises the step of embedding an array of temperature sensors at locations predicted to run hotter than other locations of the die.

16. The method of claim 13, wherein the step (b) of scanning one or more of the plurality of temperature sensors within the first semiconductor die is performed while the die is part of a wafer of dies.

17. The method of claim 16, wherein the step (b) of scanning one or more of the plurality of temperature sensors within the semiconductor die comprises the step of automatically scanning two or more of the plurality of temperature sensors simultaneously with scanning probes.

18. The method of claim 13, wherein the step (b) of scanning one or more of the plurality of temperature sensors within the first semiconductor die is performed after the die is diced from of a wafer of dies and before the die is mounted on a substrate.

19. The method of claim 13, wherein the step (b) of scanning one or more of the plurality of temperature sensors within the first semiconductor die is performed after the die is mounted on a substrate and before the substrate is wire bonded.

20. The method of claim 13, wherein the step (b) of scanning one or more of the plurality of temperature sensors within the first semiconductor die is performed after the die is wire bonded to the substrate and before the die is encapsulated.

21. The method of claim 12, wherein the step (a) comprises the step of embedding an array of temperature sensors including a first number of rows and a second number of columns.

22. The method of claim 12, wherein the step (a) comprises the step of embedding an array of temperature sensors at locations predicted to run hotter than other locations of the controller die.

23. The method of claim 12, wherein the step (b) of scanning one or more of the plurality of temperature sensors within the controller die is performed while the die is part of a wafer of dies.

24. The method of claim 12, wherein the step (b) of scanning one or more of the plurality of temperature sensors within the controller die comprises the step of automatically scanning two or more of the plurality of temperature sensors simultaneously with scanning probes.

25. The method of claim 12, wherein the step (b) of scanning one or more of the plurality of temperature sensors within the controller die is performed after the die is diced from of a wafer of dies and before the die is mounted on a substrate.

26. The method of claim 12, wherein the step (b) of scanning one or more of the plurality of temperature sensors within the controller die is performed after the die is mounted on a substrate and before the substrate is wire bonded.

27. The method of claim 12, wherein the step (b) of scanning one or more of the plurality of temperature sensors within the controller die is performed after the die is wire bonded to the substrate and before the die is encapsulated.

28. The method of claim 12, wherein the step (b) of scanning one or more of the plurality of temperature sensors within the controller die is performed after the die is encapsulated.

* * * * *